United States Patent
Masaki et al.

(10) Patent No.: US 11,259,409 B2
(45) Date of Patent: *Feb. 22, 2022

(54) CONDUCTOR SUBSTRATE, WIRING SUBSTRATE AND METHOD FOR PRODUCING WIRING SUBSTRATE

(71) Applicant: HITACHI CHEMICAL COMPANY, LTD., Tokyo (JP)

(72) Inventors: Takeshi Masaki, Tokyo (JP); Tangyii Sim, Tokyo (JP); Kumpei Yamada, Tokyo (JP); Tadahiro Ogawa, Tokyo (JP); Takashi Kawamori, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/349,716

(22) PCT Filed: Nov. 14, 2017

(86) PCT No.: PCT/JP2017/040979
§ 371 (c)(1),
(2) Date: May 14, 2019

(87) PCT Pub. No.: WO2018/092778
PCT Pub. Date: May 24, 2018

(65) Prior Publication Data
US 2019/0320527 A1    Oct. 17, 2019

(30) Foreign Application Priority Data

Nov. 15, 2016 (JP) .............. JP2016-222785
Nov. 15, 2016 (JP) .............. JP2016-222786

(Continued)

(51) Int. Cl.
*H05K 1/02* (2006.01)
*H05K 1/03* (2006.01)
(Continued)

(52) U.S. Cl.
CPC ......... *H05K 1/0283* (2013.01); *H05K 1/0393* (2013.01); *H05K 1/118* (2013.01); *H05K 1/189* (2013.01); *H05K 3/4635* (2013.01)

(58) Field of Classification Search
CPC .... H05K 1/0283; H05K 1/0393; H05K 1/118; H05K 1/189
See application file for complete search history.

(56) References Cited

U.S. PATENT DOCUMENTS 5,859,155 A * 1/1999 Furihata ............. C08G 59/4021
525/531
5,874,009 A * 2/1999 Inada ..................... H05K 3/002
216/20

(Continued)

FOREIGN PATENT DOCUMENTS

JP    H5-041575 A    2/1993
JP    H5-090737 A    4/1993
(Continued)

*Primary Examiner* — Paresh H Paghadal
(74) *Attorney, Agent, or Firm* — Fitch, Even, Tabin & Flannery, L.L.P.

(57) ABSTRACT

Disclosed is a wiring substrate 1 including a stretchable resin layer 3 and a conductor foil or conductor plating film 5 which is provided on the stretchable resin layer 3 and forms a wiring pattern.

16 Claims, 3 Drawing Sheets

(30) Foreign Application Priority Data

Apr. 21, 2017 (WO) .................. PCT/JP2017/016024
Apr. 21, 2017 (WO) .................. PCT/JP2017/016052

(51) Int. Cl.
*H05K 1/11* (2006.01)
*H05K 1/18* (2006.01)
*H05K 3/46* (2006.01)

(56) References Cited

U.S. PATENT DOCUMENTS

| | | | | |
|---|---|---|---|---|
| 8,538,230 | B2* | 9/2013 | Ochiai | C08F 265/04 385/141 |
| 9,186,092 | B2* | 11/2015 | Mestrovic | A61B 5/01 |
| 9,554,465 | B1* | 1/2017 | Liu | H05K 1/0283 |
| 9,844,133 | B2* | 12/2017 | Tomita | H05K 1/038 |
| 2001/0018122 | A1* | 8/2001 | Yuyama | C09J 163/00 428/343 |
| 2004/0238819 | A1* | 12/2004 | Maghribi | A61N 1/0551 257/57 |
| 2007/0251721 | A1* | 11/2007 | Kiuchi | H01L 23/562 174/258 |
| 2008/0039585 | A1* | 2/2008 | Nishioka | C08L 63/00 525/187 |
| 2009/0120576 | A1* | 5/2009 | Ring | H05K 3/386 156/330 |
| 2009/0130440 | A1* | 5/2009 | Ring | C09J 109/02 428/344 |
| 2009/0317639 | A1* | 12/2009 | Axisa | B32B 37/185 428/411.1 |
| 2011/0033161 | A1* | 2/2011 | Ochiai | C08F 265/04 385/124 |
| 2012/0024580 | A1* | 2/2012 | Hsu | C08G 59/4261 174/258 |
| 2012/0051005 | A1* | 3/2012 | Vanfleteren | H01L 21/565 361/749 |
| 2012/0279462 | A1* | 11/2012 | Warnery | F01P 7/167 123/41.08 |
| 2012/0314382 | A1* | 12/2012 | Wesselmann | H05K 1/0283 361/749 |
| 2014/0340857 | A1* | 11/2014 | Hsu | H05K 1/0283 361/749 |
| 2015/0380355 | A1* | 12/2015 | Rogers | H01L 23/5389 257/773 |
| 2016/0150644 | A1* | 5/2016 | Lee | B32B 15/20 174/258 |
| 2018/0199443 | A1* | 7/2018 | Okumura | H05K 3/20 |

FOREIGN PATENT DOCUMENTS

| | | |
|---|---|---|
| JP | H5-090739 A | 4/1993 |
| JP | 2000-151030 A | 5/2000 |
| JP | 2012-251896 A | 12/2012 |
| JP | 2013-187380 A | 9/2013 |
| TW | 201626472 A | 7/2016 |
| TW | 201633866 A | 9/2016 |
| WO | 2016/080346 A1 | 5/2016 |
| WO | 2016/093210 A1 | 6/2016 |

* cited by examiner

CONDUCTOR SUBSTRATE, WIRING SUBSTRATE AND METHOD FOR PRODUCING WIRING SUBSTRATE

CROSS-REFERENCE TO RELATED APPLICATIONS

This application is a U.S. national phase application filed under 35 U.S.C. § 371 of International Application No. PCT/JP2017/040979, filed Nov. 14, 2017, designating the United States, which claims priority from Japanese Application No. 2016-222785, filed Nov. 15, 2016, Japanese Application No. 2016-222786, filed Nov. 15, 2016, International Application No. PCT/JP2017/016024, filed Apr. 21, 2017, and International Application No. PCT/JP2017/016052, filed Apr. 21, 2017, which are hereby incorporated herein by reference in their entirety.

TECHNICAL FIELD

An aspect of the present invention relates to a wiring substrate which can exhibit high stretchability and a method for producing the same. Another aspect of the present invention relates to a conductor substrate which can be used to form such a wiring substrate.

BACKGROUND ART

In recent years, in the fields of wearable devices and healthcare-related devices, for example, flexibility and stretchability are required so that the devices can be used along a curved surface or a joint part of the body and hardly cause poor connection when being detached. In order to configure such devices, a wiring substrate or substrate exhibiting high stretchability is required.

Patent Literature 1 describes a method for sealing a semiconductor element such as a memory chip using a stretchable resin composition. In Patent Literature 1, application of a stretchable resin composition to a use of sealing is mainly investigated.

CITATION LIST

Patent Literature

Patent Literature 1: WO2016/080346

SUMMARY OF INVENTION

Technical Problem

As a method for imparting stretchability to a wiring substrate, a pre-stretching method has been proposed in which wrinkle-shaped metal wiring is formed by vapor-depositing a metal thin film on a substrate which has been elongated in advance and relieving the elongation. However, this method is not sufficient from the viewpoint of production efficiency since it requires a long-time vacuum process for forming a conductor by vapor deposition of metal.

A method has also been proposed in which wiring exhibiting stretchability is conveniently formed through printing using a stretchable conductive paste in which conductive particles and the like are dispersed in a stretchable elastomer. However, the wiring formed using a conductive paste has a problem that the resistance value at the time of elongation increases in addition to a higher resistance value as compared with that of metal wiring.

In such circumstances, an aspect of the present invention is to provide a conductor substrate which enables convenient production of a wiring substrate exhibiting stretchability at high productivity.

Solution to Problem

As a result of intensive investigations, the present inventors have found out that the above-described problems can be solved by combining a stretchable resin layer and a conductor foil. In other words, an aspect of the present invention provides a conductor substrate including a stretchable resin layer and a conductor foil provided on the stretchable resin layer.

Furthermore, the present inventors have found out that the above-described problems can be solved by forming a conductor plating film as a conductor layer on a stretchable resin layer. In other words, another aspect of the present invention provides a conductor substrate including a stretchable resin layer and a conductor plating film provided on the stretchable resin layer.

Advantageous Effects of Invention

The wiring substrate exhibiting stretchability according to an aspect of the present invention can be conveniently produced from a conductor substrate at high productivity. The conductor substrate according to some aspects of the present invention can exhibit high heat resistance.

DESCRIPTION OF EMBODIMENTS

Hereinafter, several embodiments of the present invention will be described in detail. However, the present invention is not limited to the following embodiments.

A conductor substrate according to an embodiment has a stretchable resin layer and a conductor layer provided on one side or both sides of the stretchable resin layer. In the present specification, the conductor substrate is referred to as "laminated sheet with a conductor layer" in some cases. A wiring substrate according to an embodiment has a stretchable resin layer and a conductor layer which is provided on one side or both sides of the stretchable resin layer and forms a wiring pattern. The conductor layer can be a conductor foil or a conductor plating film.

The elastic modulus of the conductor foil may be from 40 to 300 GPa. There is a tendency that fracture of the conductor foil due to elongation of the wiring substrate hardly occurs when the elastic modulus of the conductor foil is from 40 to 300 GPa. The elastic modulus of the conductor foil may be 50 GPa or more or 280 GPa or more and may be 60 GPa or less or 250 GPa or less from the same viewpoint. The elastic modulus of the conductor foil here can be a value measured by a resonance method.

The conductor foil can be a metal foil. Examples of the metal foil include a copper foil, a titanium foil, a stainless steel foil, a nickel foil, a permalloy foil, a 42 alloy foil, the Kovar foil, a nichrome foil, a beryllium copper foil, a phosphor bronze foil, a brass foil, a nickel silver foil, an aluminum foil, a tin foil, a lead foil, a zinc foil, a solder foil, an iron foil, a tantalum foil, a niobium foil, a molybdenum foil, a zirconium foil, a gold foil, a silver foil, a palladium foil, Monel foil, Inconel foil, and Hastelloy foil. The conductor foil may be selected from a copper foil, a gold foil, a nickel foil, and an iron foil from the viewpoint of an appropriate elastic modulus and the like. The conductor foil may be a copper foil from the viewpoint of wiring forming property. The copper foil can simply form a wiring pattern by photolithography without impairing the properties of the stretchable resin substrate.

The copper foil is not particularly limited, and it is possible to use, for example, an electrolytic copper foil and a rolled copper foil which are used in a copper-clad laminate, a flexible wiring substrate and the like. Examples of commercially available electrolytic copper foil include F0-WS-18 (trade name, manufactured by Furukawa Electric Co., Ltd.), NC-WS-20 (trade name, manufactured by Furukawa Electric Co., Ltd.), YGP-12 (trade name, manufactured by Nippon Denkai, Ltd.), GTS-1.8 (trade name, manufactured by Furukawa Electric Co., Ltd.), and F2-WS-12 (trade name, manufactured by Furukawa Electric Co., Ltd.). Examples of the rolled copper foil include TPC foil (trade name, manufactured by JX Nippon Mining & Metals Corporation), HA foil (trade name, manufactured by JX Nippon Mining & Metals Corporation), HA-V2 foil (trade name, manufactured by JX Nippon Mining & Metals Corporation), and C1100R (trade name, manufactured by MITSUI SUMITOMO METAL MINING BRASS & COPPER CO., LTD.). A copper foil subjected to a roughening treatment may be used from the viewpoint of adhesion property to the stretchable resin layer. A rolled copper foil may be used from the viewpoint of folding endurance.

The metal foil may have a roughened surface formed by a roughening treatment. In this case, a metal foil is typically provided on the stretchable resin layer in a direction in which the roughened surface is in contact with the stretchable resin layer. The surface roughness Ra of the roughened surface may be from 0.1 to 3 μm or from 0.2 to 2.0 μm from the viewpoint of adhesion property between the stretchable resin layer and the metal foil. In order to easily form fine wiring, the surface roughness Ra of the roughened surface may be from 0.3 to 1.5 μm.

The surface roughness Ra can be measured, for example, using a surface shape measuring apparatus Wyko NT9100 (manufactured by Veeco Instruments Inc.) under the following conditions.

Measurement Conditions
Internal lens: 1-fold
External lens: 50-fold
Measurement range: 0.120×0.095 mm
Measurement depth: 10 μm
Measurement method: vertical scanning interferometry (VSI)

The thickness of the conductor foil is not particularly limited but may be from 1 to 50 μm. The wiring pattern can be more easily formed when the thickness of the conductor foil is 1 μm or more. It is particularly easy to etch and handle the conductor foil when the thickness thereof is 50 μm or less.

The conductor foil is provided on one side or both sides of the stretchable resin layer. It is possible to suppress warpage due to heating conducted for curing and the like by providing the conductor foil on both sides of the stretchable resin layer.

The method for providing the conductor foil is not particularly limited, but for example, there are a method in which the metal foil is directly coated with a resin composition for forming a stretchable resin layer and a method in which a carrier film is coated with a resin composition for forming a stretchable resin layer to form a resin layer and the resin layer formed is laminated on the conductor foil.

The conductor plating film can be formed by an ordinary plating method to be used in an additive method or a semi-additive method. For example, a plating catalyst imparting treatment for depositing palladium is conducted and then the stretchable resin layer is immersed in an electroless plating solution to precipitate an electroless plating layer (conductor layer) having a thickness of from 0.3 to 1.5 μm on the entire surface of the primer. If necessary, electrolytic plating (electroplating) can be further conducted to adjust the thickness to the required thickness. The electroless plating solution to be used in electroless plating is not particularly limited and any electroless plating solution can be used. The method for electrolytic plating is also not particularly limited and an ordinary method can be adopted. The conductor plating film (film by electroless plating, film by electrolytic plating) may be a copper-plated film from the viewpoint of cost and resistance value.

Furthermore, unnecessary parts can be removed by etching to form a circuit layer. The etching solution to be used in etching can be appropriately selected depending on the kind of plating. For example, in a case in which the conductor is copper plating, for example, a mixed solution of concentrated sulfuric acid and a hydrogen peroxide solution, or a ferric chloride solution can be used as the etching solution to be used in etching.

In order to improve the adhesive force with the conductor plating film, irregularities may be formed on the stretchable resin layer in advance. Examples of a method for forming irregularities include a method in which the roughened surface of a copper foil is transferred. As the copper foil, for example, YGP-12 (trade name, manufactured by Nippon Denkai, Ltd.), GTS-18 (trade name, manufactured by Furukawa Electric Co., Ltd.), or F2-WS-12 (trade name, manufactured by Furukawa Electric Co., Ltd.) can be used.

As a method for transferring the roughened surface of a copper foil, for example, there are a method in which the roughened surface of a copper foil is directly coated with a resin composition for forming a stretchable resin layer and a method in which a carrier film is coated with a resin composition for forming a stretchable resin layer and then a resin layer (stretchable resin composition layer) is molded on a copper foil. It is possible to suppress warpage due to heating conducted for curing and the like by providing the conductor plating film on both sides of the stretchable resin layer.

The stretchable resin layer may be subjected to a surface treatment for the purpose of achieving high adhesion with the conductor plating film. Examples of the surface treatment include a roughening treatment (desmear treatment), a UV treatment, and a plasma treatment which are used in a general wiring board process.

As a desmear treatment, a method to be used in a general production process of a wiring board may be used, and for example, an aqueous solution of sodium permanganate can be used.

Figure 1:
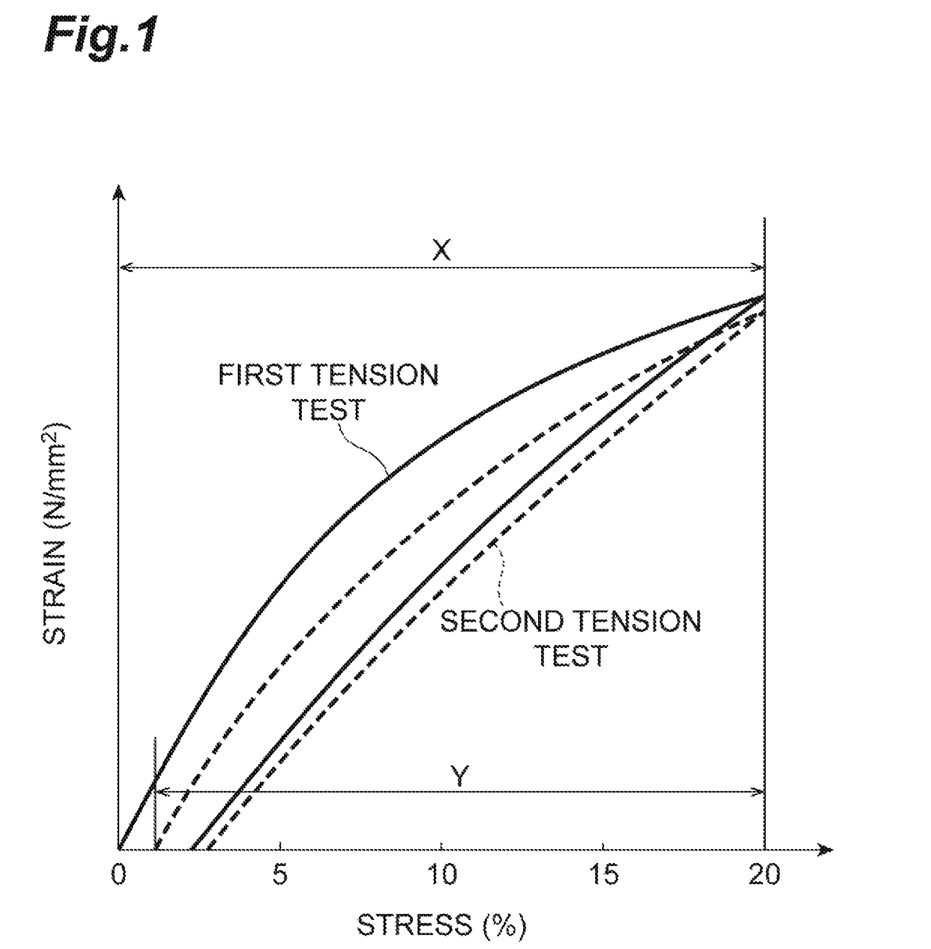
FIG. 1 is a stress-strain curve illustrating a measurement example of a recovery factor.

The stretchable resin layer can exhibit stretchability so that the recovery factor after tensile deformation to, for example, a strain of 20% is 80% or more. This recovery factor is determined in a tension test using a measurement sample of a stretchable resin layer. R to be calculated by an equation: R (%)=(Y/X)×100, where X denotes the strain (displacement magnitude) applied in the first tension test and Y denotes the difference between X and the position at which the load starts to be applied when the position is returned to the initial position and the tension test is conducted again is defined as the recovery factor. The recovery factor can be measured by setting X to 20%. FIG. 1 is a stress-strain curve illustrating a measurement example of the recovery factor. The recovery factor may be 80% or more, 85% or more, or 90% or more from the viewpoint of resistance to repeated use. The upper limit of the recovery factor upon the definition is 100%.

The elastic modulus (elastic modulus in tension) of the stretchable resin layer may be 0.1 MPa or more and 1000 MPa or less. The handling properties and flexibility as a substrate tend to be particularly excellent when the elastic modulus is 0.1 MPa or more and 1000 MPa or less. From this viewpoint, the elastic modulus may be 0.3 MPa or more and 100 MPa or less or 0.5 MPa or more and 50 MPa or less.

The elongation at break of the stretchable resin layer may be 100% or more. Sufficient stretchability tends to be obtained when the elongation at break is 100% or more. From this viewpoint, the elongation at break may be 150% or more, 200% or more, 300% or more, or 500% or more. The upper limit of the elongation at break is not particularly limited but is typically about 1000% or less.

The stretchable resin layer can contain (A) a rubber component. The stretchability is easily imparted to the stretchable resin layer mainly by this rubber component. The content of the rubber component may be from 30% to 100% by mass with respect to 100% by mass of the stretchable resin layer.

As the rubber component, for example, it is possible to contain at least one kind of rubber selected from the group consisting of acrylic rubber, isoprene rubber, butyl rubber, styrene butadiene rubber, butadiene rubber, acrylonitrile butadiene rubber, silicone rubber, urethane rubber, chloroprene rubber, ethylene propylene rubber, fluororubber, sulfurized rubber, epichlorohydrin rubber, and chlorinated butyl rubber. A rubber component exhibiting low gas permeability may be used from the viewpoint of protecting damage to the wiring due to moisture absorption and the like. From this viewpoint, the rubber component may contain at least one kind selected from styrene butadiene rubber, butadiene rubber, and butyl rubber. By using styrene butadiene rubber, the resistance of the stretchable resin layer to various kinds of chemical solutions to be used in the plating process is improved and the wiring substrate can be produced at a favorable yield.

Examples of commercially available products of acrylic rubber include "Nipol AR series" manufactured by Zeon Corporation and "KURARITY series" manufactured by Kuraray Co., Ltd.

Examples of commercially available products of isoprene rubber include "Nipol IR series" manufactured by Zeon Corporation.

Examples of commercially available products of butyl rubber include "BUTYL series" manufactured by JSR Corporation.

Examples of commercially available products of styrene butadiene rubber include "DYNARON SEBS series" and "DYNARON HSBR series" manufactured by JSR Corporation, "KRATON D polymer series" manufactured by Kraton Corporation, and "AR Series" manufactured by ARONKASEI CO., LTD.

Examples of commercially available products of butadiene rubber include "Nipol BR series" manufactured by Zeon Corporation.

Examples of commercially available products of acrylonitrile butadiene rubber include "JSR NBR series" manufactured by JSR Corporation.

Examples of commercially available products of silicone rubber include "KMP series" manufactured by Shin-Etsu Chemical Co., Ltd.

Examples of commercially available products of ethylene propylene rubber include "JSR EP series" manufactured by JSR Corporation.

Examples of commercially available products of fluororubber include "DAI-EL series" manufactured by DAIKIN INDUSTRIES, LTD.

Examples of commercially available products of epichlorohydrin rubber include "Hydrin series" manufactured by Zeon Corporation.

The rubber component can also be fabricated through synthesis. For example, acrylic rubber can be obtained by reacting (meth)acrylic acid, a (meth)acrylic acid ester, an aromatic vinyl compound, a vinyl cyanide compound and the like.

The rubber component may contain rubber having a crosslinking group. There is a tendency that the heat resistance of the stretchable resin layer is easily improved, with using the rubber having a crosslinking group. The crosslinking group may be any reactive group capable of progressing the reaction to crosslink the molecular chain of the rubber component. Examples thereof include a reactive group of (B) a crosslinking component to be described later, an acid anhydride group, an amino group, a hydroxyl group, an epoxy group, and a carboxyl group.

The rubber component may contain rubber having at least either crosslinking group of an acid anhydride group or a carboxyl group. Examples of the rubber having an acid anhydride group include rubber that is partially modified with maleic anhydride. The rubber partially modified with maleic anhydride is a polymer having a structural unit derived from maleic anhydride. As a commercially available product of rubber partially modified with maleic anhydride, for example, there is styrene-based elastomer "TUFPRENE 912" manufactured by Asahi Kasei Corp.

The rubber partially modified with maleic anhydride may be a hydrogenated type styrene-based elastomer which is partially modified with maleic anhydride. The hydrogenated type styrene-based elastomer can also be expected to have an effect such as improvement in weather resistance. The hydrogenated type styrene-based elastomer is an elastomer to be obtained by a reaction of adding hydrogen to the unsaturated double bond of a styrene-based elastomer having a soft segment containing an unsaturated double bond. As examples of commercially available products of the hydrogenated type styrene-based elastomer partially modified with maleic anhydride, there are "FG1901" and "FG1924" manufactured by Kraton Corporation and "TUFTEC M1911", "TUFTEC M1913", and "TUFTEC M1943" manufactured by Asahi Kasei Corp.

The weight average molecular weight of the rubber component may be from 20000 to 200000, from 30000 to 150000, or from 50000 to 125000 from the viewpoint of coating properties. The weight average molecular weight (Mw) here means a value in terms of standard polystyrene to be determined by gel permeation chromatography (GPC).

The stretchable resin layer may be a cured product of a resin composition containing (A) the rubber component. In this case, a curable resin composition is used as the resin composition for forming a stretchable resin layer. This curable resin composition may further contain, for example, (B) a crosslinking component. In other words, the stretchable resin layer may further contain a crosslinked polymer of (B) the crosslinking component. The crosslinking component may be a compound having at least one kind of reactive group selected from the group consisting of a (meth)acrylic group, a vinyl group, an epoxy group, a styryl group, an amino group, an isocyanurate group, a ureido group, a cyanate group, an isocyanate group, a mercapto group, a hydroxyl group, and a carboxyl group, and a cured product containing a crosslinked polymer can be formed by the reaction of these reactive groups. The crosslinking component may be a compound having a reactive group selected from an epoxy group, an amino group, a hydroxyl group, or a carboxyl group from the viewpoint of improving the heat resistance of the stretchable resin layer. These compounds can be used singly or in combination of two or more kinds thereof.

Examples of the compound having a (meth)acryl group include a (meth)acrylate compound. The (meth)acrylate compound may be monofunctional, bifunctional, or polyfunctional, and is not particularly limited, but may be a bifunctional or polyfunctional (meth)acrylate in order to obtain sufficient curability.

Examples of the monofunctional (meth)acrylate include aliphatic (meth)acrylates such as methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octylheptyl (meth)acrylate, nonyl (meth)acrylate, decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, stearyl (meth)acrylate, behenyl (meth)acrylate, 2-hydroxyethyl (meth)acrylate, 2-hydroxypropyl (meth)acrylate, 3-chloro-2-hydroxypropyl (meth)acrylate, 2-hydroxybutyl (meth)acrylate, methoxy polyethylene glycol (meth)acrylate, ethoxy polyethylene glycol (meth)acrylate, methoxy polypropylene glycol (meth)acrylate, ethoxy polypropylene glycol (meth)acrylate, and mono(2-(meth)acryloyloxyethyl) succinate; alicyclic (meth)acrylates such as cyclopentyl (meth)acrylate, cyclohexyl (meth)acrylate, cyclopentyl (meth)acrylate, dicyclopentanyl (meth)acrylate, dicyclopentenyl (meth)acrylate, isobornyl (meth)acrylate, mono(2-(meth)acryloyloxyethyl) tetrahydrophthalate, and mono(2-(meth)acryloyloxyethyl) hexahydrophthalate; aromatic (meth)acrylates such as benzyl (meth)acrylate, phenyl (meth)acrylate, o-biphenyl (meth)acrylate, 1-naphthyl (meth)acrylate, 2-naphthyl (meth)acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxy polyethylene glycol (meth)acrylate, nonyl phenoxy polyethylene glycol (meth)acrylate, phenoxy polypropylene glycol (meth)acrylate, 2-hydroxy-3-phenoxypropyl (meth)acrylate, 2-hydroxy-3-(o-phenylphenoxy)propyl (meth)acrylate, 2-hydroxy-3-(1-naphthoxy)propyl (meth)acrylate, and 2-hydroxy-3-(2-naphthoxy)propyl (meth)acrylate; heterocyclic (meth)acrylates such as 2-tetrahydrothrfuryl (meth)acrylate, N-(meth)acryloyloxyethylhexahydrophthimide, and meth)acryloyloxyethyl-N-carbazole, and caprolactone-modified products thereof. Among these, a monofunctional (meth)acrylate may be selected from the above-described aliphatic (meth)acrylates and the above-described aromatic (meth)acrylates from the viewpoint of compatibility with the styrene-based elastomer, transparency, and heat resistance.

Examples of the bifunctional (meth)acrylate include aliphatic (meth)acrylates such as ethylene glycol di(meth)acrylate, diethylene glycol di(meth)acrylate, triethylene glycol di (meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-propanediol di(meth)acrylate, 1,9-nonanediol di(meth)acrylate, 1,10-decanediol di(meth)acrylate, glycerine di(meth)acrylate, tricyclodecanedimethanol (meth)acrylate, and ethoxylated 2-methyl-1,3-propanediol di(meth)acrylate; Acyclic (meth)acrylates such as cyclohexanedimethanol (meth)acrylate, ethoxylated cyclohexanedimethanol (meth)acrylate, propoxylated cyclohexanedimethanol (meth)acrylate, ethoxylated and propoxylated cyclohexanedimethanol (meth)acrylate, tricyclodecanedimethanol (meth)acrylate, ethoxylated tricyclodecanedimethanol (meth)acrylate, propoxylated tricyclodecanedimethanol (meth)acrylate, ethoxylated and propoxylated tricyclodecanedimethanol (meth)acrylate, ethoxylated and hydrogenated bisphenol A di(meth)acrylate, propoxylated and hydrogenated bisphenol A di(meth)acrylate, ethoxylated and propoxylated and hydrogenated bisphenol A di(meth)acrylate, ethoxylated and hydrogenated bisphenol F di(meth)acrylate, propoxylated and hydrogenated bisphenol F di(meth)acrylate, and ethoxylated and propoxylated and hydrogenated bisphenol F di(meth)acrylate; aromatic (meth)acrylates such as ethoxylated bisphenol A di(meth)acrylate, propoxylated bisphenol A di(meth)acrylate, ethoxylated and propoxylated bisphenol A di(meth)acrylate, ethoxylated bisphenol F di(meth)acrylate, propoxylated bisphenol F di(meth)acrylate, ethoxylated and propoxylated bisphenol F di(meth)acrylate, ethoxylated bisphenol AF di(meth)acrylate, propoxylated bisphenol AF di(meth)acrylate, ethoxylated and propoxylated bisphenol AF di(meth)acrylate, ethoxylated fluorene type di(meth)acrylate, propoxylated fluorene type di(meth)acrylate, and ethoxylated and propoxylated fluorene type di(meth)acrylate; heterocyclic (meth)acrylates such as ethoxylated isocyanuric acid di(meth)acrylate, propoxylated isocyanuric acid di(meth)acrylate, and ethoxylated and propoxylated isocyanuric acid di(meth)acrylate; caprolactone-modified products thereof; aliphatic epoxy (meth)acrylates such as neopentyl glycol type epoxy (meth)acrylate; alicyclic epoxy (meth)acrylates such as cyclohexanedimethanol type epoxy (meth)acrylate, hydrogenated bisphenol A type epoxy (meth)acrylate, and hydrogenated bisphenol F type epoxy (meth)acrylate; and aromatic epoxy (meth)acrylates such as resorcinol type epoxy (meth)acrylate, bisphenol A type epoxy (meth)acrylate, bisphenol F type epoxy (meth)acrylate, bisphenol AF type epoxy (meth)acrylate, and fluorene type epoxy (meth)acrylate. Among these, a bifunctional (meth)acrylate may be selected from the above-described aliphatic (meth)acrylates and the above-described aromatic (meth)acrylates from the viewpoint of compatibility with the styrene-based elastomer, transparency, and heat resistance.

Examples of tri- or higher polyfunctional (meth)acrylates include aliphatic (meth)acrylates such as trimethylolpropane tri(meth)acrylate, ethoxylated trimethylolpropane tri(meth)acrylate, propoxylated trimethylolpropane tri(meth)acrylate, ethoxylated and propoxylated trimethylolpropane tri(meth)acrylate, pentaerythritol tri(meth)acrylate, ethoxylated pentaerythritol tri(meth)acrylate, propoxylated pentaerythritol tri(meth)acrylate, ethoxylated and propoxylated pentaerythritol tri(meth)acrylate, pentaerythritol tetra(meth)acrylate, ethoxylated pentaerythritol tetra(meth)acrylate, propoxylated pentaerythritol tetra(meth)acrylate, ethoxylated and propoxylated pentaerythritol tetra(meth)acrylate, ditrimethylolpropane tetraacrylate, and dipentaerythritol hexa(meth)acrylate; heterocyclic (meth)acrylates such as ethoxylated isocyanuric acid tri(meth)acrylate, propoxylated isocyanuric acid tri(meth)acrylate, and ethoxylated and propoxylated isocyanuric acid tri(meth)acrylate; caprolactone-modified products thereof; and aromatic epoxy (meth)acrylates such as phenol novolac type epoxy (meth)acrylate and cresol novolac type epoxy (meth)acrylate. Among these, a polyfunctional (meth)acrylate may be selected from the above-described aliphatic (meth)acrylates and the above-described aromatic (meth)acrylates from the viewpoint of compatibility with the styrene-based elastomer, transparency, and heat resistance.

By a combination of rubber having a maleic anhydride group or a carboxyl group with a compound (epoxy resin) having an epoxy group, excellent effects are obtained particularly from the viewpoint of heat resistance and low moisture permeability of the stretchable resin layer, adhesion property between the stretchable resin layer and the conductor layer, and low tackiness of the resin layer after being cured. It is possible to suppress deterioration of the stretchable resin layer, for example, in a heating step such as nitrogen reflowing when the heat resistance of the stretchable resin layer is improved. It is possible to handle the conductor substrate or the wiring substrate with favorable workability when the resin layer after being cured exhibits low tackiness.

The compound containing an epoxy group is not particularly limited as long as it has an epoxy group in the molecule and can be, for example, a general epoxy resin. The epoxy resin may be monofunctional, bifunctional, or polyfunctional, and is not particularly limited, but a bifunctional or polyfunctional epoxy resin may be used in order to obtain sufficient curability.

Examples of the epoxy resin include bisphenol A type, bisphenol F type, phenol novolac type, naphthalene type, dicyclopentadiene type, and cresol novolac type epoxy resins. Epoxy resins modified with a fifty chain can impart flexibility. Examples of a commercially available fatty chain-modified epoxy resin include EXA-4816 manufactured by DIC Corporation. A phenol novolac type, cresol novolac type, naphthalene type, or dicyclopentadiene type epoxy resin may be selected from the viewpoint of curability, low tackiness, and heat resistance. These epoxy resins can be used singly or in combination of two or more kinds thereof.

The content of the crosslinked polymer formed from the crosslinking component may be from 10% to 50% by mass based on the mass of the stretchable resin layer. When the content of the crosslinked polymer formed from the crosslinking component is in the above-described range, the adhesion force with the conductor foil or the conductor plating film tends to be improved while maintaining the properties of the stretchable resin layer. From the above viewpoint, the content of the crosslinked polymer formed from the crosslinking component may be from 15% to 40% by mass. The content of the crosslinking component in the resin composition for forming a stretchable resin layer may be in these ranges.

The stretchable resin layer or the resin composition to be used for forming this stretchable resin layer can further contain an additive as (C) a component, (C) the additive may be at least either of a curing agent or a curing accelerator. The curing agent itself is a compound participating in the curing reaction, and the curing accelerator is a compound functioning as a catalyst of the curing reaction. It is also possible to use compounds having the functions as both of a curing agent and a curing accelerator. The curing agent may be a polymerization initiator. These can be appropriately selected according to other components to be contained in the resin composition. For example, a polymerization initiator may be added when the resin composition is a resin composition containing a (meth)acrylate compound and the like. The polymerization initiator is not particularly limited as long as it initiates polymerization by being heated or irradiated with ultraviolet light and the like, and for example, a thermal radical polymerization initiator or a photo radical polymerization initiator can be used. The thermal radical initiator is likely to uniformly progress the reaction of the resin composition. The photo radical initiator enables room temperature curing and is thus advantageous from the viewpoint of preventing deterioration of the device due to heat and of being able to suppress warpage of the stretchable resin layer.

Examples of the thermal radical polymerization initiator include ketone peroxides such as methyl ethyl ketone peroxide, cyclohexanone peroxide, and methylcyclohexanone peroxide; peroxyketals such as 1,1-bis(t-butylperoxy)cyclohexane, 1,1-bis(t-butylperoxy)-2-methylcyclohexane, 1,1-bis(t-butylperoxy)-3,3,5-trimethylcyclohexane, 1,1-bis(t-hexylperoxy)cyclohexane, and 1,1-bis(t-hexylperoxy)-3,3,5-trimethylcyclohexane; hydroperoxides such as p-menthane hydroperoxide; dialkyl peroxides such as $\alpha,\alpha'$-bis(t-butylperoxy)diisopropylbenzene, dicumyl peroxide, t-butyl cumyl peroxide, and di-t-butyl peroxide; diacyl peroxides such as octanoyl peroxide, lauroyl peroxide, stearyl peroxide, and benzoyl peroxide; peroxycarbonates such as bis(4-t-butylcyclohexyl)peroxydicarbonate, di-2-ethoxyethyl peroxydicarbonate, di-2-ethylhexyl peroxydicarbonate, and di-3-methoxybutyl peroxycarbonate; peroxy esters such as t-butyl peroxy pivalate, t-hexyl peroxy pivalate, 1,1,3,3-tetamethylbutyl peroxy-2-ethylhexanoate, 2,5-dimethyl-2,5-bis(2-ethylhexanoylperoxy)hexane, t-hexyl peroxy-2-ethylhexanoate, t-butyl peroxy-2-ethylhexanoate, t-butyl peroxy isobutyrate, t-hexyl peroxy isopropyl monocarbonate, t-butyl peroxy-3,5,5-trimethylhexanoate, t-butyl peroxy laurate, t-butyl peroxy isopropyl monocarbonate, t-butyl peroxy-2-ethylhexyl monocarbonate, t-butyl peroxy benzoate, t-hexyl peroxy benzoate, 2,5-dimethyl-2,5-bis(benzoylperoxy)hexane, and t-butyl peroxy acetate; and azo compounds such as 2,2'-azobisisobutyronitrile, 2,2'-azobis(2,4-dimethylvaleronitrile), and 2,2'-azobis(4-methoxy-2'-dimethylvaleronitrile). Among these, a thermal radical polymerization initiator may be selected from the above-described diacyl peroxides, the above-described peroxy esters, and the above-described azo compounds from the viewpoint of curability, transparency, and heat resistance.

Examples of the photo radical polymerization initiator include benzoin ketals such as 2,2-dimethoxy-1,2-diphenylethane-1-one; $\alpha$-hydroxy ketones such as 1-hydroxycyclohexyl phenyl ketone, 2-hydroxy-2-methyl-1-phenylpropan-1-one, and 1-[4-(2-hydroxyethoxy)phenyl]-2-hydroxy-2-methyl-1-propan-1-one; $\alpha$-aminoketones such as 2-benzyl-2-dimethylamino-1-(4-morpholinophenyl)-butan-1-one and 1,2-methyl-1-[4-(methylthio)phenyl]-2-morpholinopropan-1-one; oxime esters such as 1-[(4-phenylthio)phenyl]-1,2- octadione-2-(benzoyl)oxime; phosphine oxides such as bis (2,4,6-trimethylbenzoyl)phenylphosphine oxide, bis(2,6-dimethoxybenzoyl)-2,4,4-trimethylpentylphosphine oxide, and 2,4,6-trimethylbenzoyldiphenylphosphine oxide; 2,4,5-triarylimidazole dimers such as 2-(o-chlorophenyl)-4,5-diphenylimidazole dimer, 2-(o-chlorophenyl)-4,5-di(methoxyphenyeimidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer; benzophenone compounds such as benzophenone, N,N,N',N'-tetramethyl-4,4'-diaminobenzophenone, N,N''-tetraethyl-4,4'-diaminobenzophenone, and 4-methoxy-4'-dimethylaminobenzophenone; quinone compounds such as 2-ethylanthraquinone, phenanthrenequinone, 2-tert-butyl anthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethyl anthraquinone benzoin ethers such as benzoin methyl ether, benzoin ethyl ether, and benzoin phenyl ether; benzoin compounds such as benzoin, methylbenzoin, and ethylbenzoin; benzyl compounds such as benzyl dimethyl ketal; acridine compounds such as 9-phenylacridine and 1,7-bis(9,9'-acridinylheptane): N-phenylglycine, and coumarin.

In the 2,4,5-triarylimidazole dimers, as the substituents of the aryl groups at the two triarylimidazole moieties, identical and symmetrical compounds or different and asymmetric compounds may be provided. A thioxanthone compound and a tertiary amine may be combined, such as a combination of diethylthioxanthone with dimethylaminobenzoic acid.

Among these, a photo radical polymerization initiator may be selected from the above-described α-hydroxy ketones and the above-described phosphine oxides from the viewpoint of curability, transparency, and heat resistance. These thermal and photo radical polymerization initiators can be used singly or in combination of two or more kinds thereof. Furthermore, these can also be combined with an appropriate sensitizer.

In a case in which the curable resin composition for forming a stretchable resin layer contains (A) the rubber component, (B) the crosslinking component, and the curing agent as the component (C), the content of the curing agent (or polymerization initiator) may be from 0.1 to 10 parts by mass with respect to 100 parts by mass of the total amount of the rubber component and the crosslinking component. There is a tendency that sufficient curing is easily obtained when the content of the curing agent (or polymerization initiator) is 0.1 part by mass or more. There is a tendency that sufficient light permeability is easily obtained when the content of the curing agent (or polymerization initiator) is 10 parts by mass or less. From the above viewpoint, the content of the curing agent (or polymerization initiator) may be from 0.3 to 7 parts by mass or from 0.5 to 5 parts by mass.

The curing agent may contain at least one kind selected from the group consisting of an aliphatic polyamine, a polyaminoamide, a polymercaptan, an aromatic polyamine, an acid anhydride, a carboxylic acid, a phenol novolac resin, an ester resin, and dicyandiamide. These curing agents can be combined with, for example, a compound (epoxy resin) having an epoxy group.

A curing accelerator selected from a tertiary amine, imidazole, an acid anhydride, or phosphine may be added to the resin composition containing an epoxy resin as the component (C), Imidazole may be used from the viewpoint of storage stability and curability of the varnish. In a case in which the rubber component contains rubber which is partially modified with maleic anhydride, imidazole compatible therewith may be selected.

In a case in which the resin composition for forming a stretchable resin layer contains (A) the rubber component and (B) the crosslinking component, the content of imidazole may be from 0.1 to 10 parts by mass with respect to 100 parts by mass of the total amount of the rubber component and the crosslinking component. There is a tendency that sufficient curing is easily obtained when the content of imidazole is 0.1 part by mass or more. There is a tendency that sufficient heat resistance is easily obtained when the content of imidazole is 10 parts by mass or less. From the above viewpoint, the content of imidazole may be from 0.3 to 7 parts by mass or from 0.5 to 5 parts by mass.

In a case in which the resin composition for thrilling a stretchable resin layer contains (A) the rubber component, (B) the crosslinking component, and (C) the additive, the content of the rubber component may be from 30% to 98% by mass, from 50% to 97% by mass, or from 60% to 95% by mass based on the total amount of (A) the rubber component, (B) the crosslinking component, and (C) the component. Sufficient stretchability is easily obtained when the content of the rubber component is 30 mass % or more. The stretchable resin layer tends to exhibit excellent properties particularly from the viewpoint of adhesion property, insulation reliability, and heat resistance when the content of the rubber component is 98% by mass or less.

The stretchable resin layer or the resin composition for forming the stretchable resin layer may further contain an antioxidant, a yellowing inhibitor, an ultraviolet absorber, a visible light absorber, a coloring agent, a plasticizer, a stabilizer, a filler, a flame retardant, a leveling agent, and the like in addition to the above components if necessary in a range in which the effect of the present invention is not significantly impaired.

The stretchable resin layer or the resin composition for forming the stretchable resin layer may contain particularly at least one kind of deterioration inhibitor selected from the group consisting of an antioxidant, a heat stabilizer, a light stabilizer, and a hydrolysis inhibitor. The antioxidant suppresses deterioration due to oxidation. The antioxidant also imparts sufficient heat resistance to the stretchable resin layer at a high temperature. The heat stabilizer imparts stability to the stretchable resin layer at a high temperature. Examples of the light stabilizer include an ultraviolet absorber for preventing deterioration due to ultraviolet light, a light blocking agent for blocking light, and a quencher having a quenching function to receive the light energy absorbed by an organic material and stabilize the organic material. The hydrolysis inhibitor suppresses deterioration due to moisture. The deterioration inhibitor may be at least one kind selected from the group consisting of an antioxidant, a thermal stabilizer, and an ultraviolet absorber. As the deterioration inhibitor, only one kind may be used among the components exemplified above, or two or more kinds thereof may be used concurrently. Two or more kinds of deterioration inhibitors may be used concurrently in order to obtain a superior effect.

The antioxidant may be, for example, one or more kinds selected from the group consisting of a phenol-based antioxidant, an amine-based antioxidant, a sulfur-based antioxidant, and a phosphite-based antioxidant. Two or more kinds of antioxidants may be used concurrently in order to obtain a superior effect. A phenol-based antioxidant and a sulfur-based antioxidant may be used concurrently.

The phenol-based antioxidant may be a compound having a greatly sterically hindered substituent such as a t-butyl group (tertiary butyl group) and a trimethylsilyl group at the ortho position of the phenolic hydroxyl group. The phenol-based antioxidant is also called a hindered phenol-based antioxidant.

The phenol-based antioxidant may be, for example, one or more kinds of compounds selected from the group consisting of 2-t-butyl-4-methoxyphenol, 3-t-butyl-4-methoxyphenol, 2,6-di-t-butyl-4-ethylphenol, 2,2'-methylene-bis(4-methyl-6-t-butylphenol), 4,4'-thiobis-(3-methyl-6-t-butylphenol), 4,4'-butylidenebis(3-methyl-6-t-butylphenol), 1,1,3-tris(2-methyl-4-hydroxy-5-t-butylphel)butane, 1,3,5-trimethyl-2,4,6-tris(3,5-di-t-butyl-4-hydroxybenzyl)benzene, and tetrakis-[methylene-3-(3',5'-di-t-butyl-4'-hydroxyphenyl)propionate]methane. The phenol-based antioxidant may be a polymer type phenol-based antioxidant typified by 1,3,5-trimethyl-2,4,6-tris(3,5-di-t-butyl-4-hydroxybenzyl)benzene and tetrakis-[methylene-3-(3',5'-di-t-butyl-4'-hydroxyphenyl)propionate]methane.

The phosphite-based antioxidant may be one or more kinds of compounds selected from the group consisting of triphenyl phosphite, diphenylisodecyl phosphite, phenyldiisodecyl phosphite, 4,4'-butylidene-bis(3-methyl-6-t-butylphenylditridecyl) phosphite, cyclic neopentane tetraylbis(nonylphenyl) phosphite, cyclic neopentane tetraylbis(dinonylphenyl) phosphite, cyclic neopentane tetrayltris(nonylphenyl) phosphite, cyclic neopentane tetrayltris(dinonylphenyl) phosphite, 10-(2,5-dihydroxyphenyl)-10H-9-oxa-10-phosphaphenanthrene-10-oxide, 2,2-methylenebis(4,6-di-t-butylphenyl)-2-ethylhexyl phosphite, diisodecyl pentaerythritol diphosphate, and tris(2,4-di-t-butylphenyl) phosphite or may be tris(2,4-di-t-butylphenyl) phosphite.

Examples of other antioxidants include hydroxylamine-based antioxidants typified by N-methyl-2-dimethylaminoacetohydroxamic acid and sulfur-based antioxidants typified by dilauryl 3,3'-thiodipropionate.

The content of the antioxidant may be from 0.1% to 20% by mass based on the mass of the stretchable resin layer or the resin composition for firming the stretchable resin layer. Sufficient heat resistance of the stretchable resin layer is easily obtained when the content of the antioxidant is 0.1 part by weight or more. Bleeding and blooming can be suppressed when the content of the antioxidant is 20 parts by weight or less.

The molecular weight of the antioxidant may be 400 or more, 600 or more, or 750 or more from the viewpoint of preventing sublimation during heating. In the case of containing two or more kinds of antioxidants, the average of molecular weights thereof may be in the above-described range.

Examples of the thermal stabilizer (heat deterioration inhibitor) include a metal soap or an inorganic acid salt such as a combination of a zinc salt with a barium salt of higher fatty acids, an organic tin compound such as organotin maleate or organotin mercapto, and a fullerene (for example, fullerene hydroxide).

Examples of the ultraviolet absorber include a benzophenone-based ultraviolet absorber typified by 2,4-dihydroxybenzophenone, a benzotriazole-based ultraviolet absorber typified by 2-(2'-hydroxy-5'-methylphenyl)benzotriazole, and a cyanoacrylate-based ultraviolet absorber typified by 2-ethylhexyl-2-cyano-3,3'-diphenylacrylate.

Examples of the hydrolysis inhibitor include a carbodiimide derivative, an epoxy compound, an isocyanate compound, an acid anhydride, an oxazoline compound, and a melamine compound.

Examples of other deterioration inhibitors include a hindered amine-based light stabilizer, ascorbic acid, propyl gallate, catechin, oxalic acid, malonic acid, and a phosphorous acid ester.

The stretchable resin layer can be produced by, for example, a method including dissolving or dispersing the rubber component and, if necessary, other components in an organic solvent to obtain a resin varnish and forming a film of the resin varnish on a conductor foil or a carrier film by a method to be described later.

The organic solvent to be used here is not particularly limited, but examples thereof include aromatic hydrocarbons such as toluene, xylene, mesitylene, cumene, and p-cymene; cyclic ethers such as tetrahydrofuran and 1,4-dioxane; ketones such as acetone, methyl ethyl ketone, methyl isobutyl ketone, cyclohexanone, and 4-hydroxy-4-methyl-2-pentanone; esters such as methyl acetate, ethyl acetate, butyl acetate, methyl lactate, ethyl lactate, and γ-butyrolactone; carbonic acid esters such as ethylene carbonate and propylene carbonate; and amides such as N,N-dimethylformamide, N,N-dimethylacetamide, and N-methylpyrrolidone. Toluene or N,N-dimethylacetamide may be used from the viewpoint of solubility and boiling point. These organic solvents can be used singly or in combination of two or more kinds thereof. The concentration of solids (components other than the organic solvent) in the resin varnish may be from 20% to 80% by mass.

The carrier film is not particularly limited, but examples thereof include polyesters such as polyethylene terephthalate (PET), polybutylene terephthalate, and polyethylene naphthalate; polyolefins such as polyethylene and polypropylene; a polycarbonate, a polyamide, a polyimide, a polyamide-imide, a polyether imide, a polyether sulfide, a polyether sulfone, a polyether ketone, a polyphenylene ether, a polyphenylene sulfide, a polyarylate, a polysulfone, and a liquid crystal polymer. Among these, a film of polyethylene terephthalate, polybutylene terephthalate, polyethylene naphthalate, polypropylene, a polycarbonate, a polyamide, a polyimide, a polyamide-imide, a polyphenylene ether, a polyphenylene sulfide, a polyarylate, or a polysulfone may be used as a carrier film from the viewpoint of flexibility and toughness.

The thickness of the carrier film is not particularly limited but may be from 3 to 250 µm. The film strength is sufficient when the thickness of the carrier film is 3 µm or more, and sufficient flexibility is obtained when the thickness of the carrier film is 250 µm or less. From the above viewpoint, the thickness may be from 5 to 200 µm or from 7 to 150 µm. A film of which the base film has been subjected to a release treatment using a silicone-based compound, a fluorine-containing compound and the like may be used if necessary from the viewpoint of improving the releasability from the stretchable resin layer.

If necessary, a protective film may be stuck on the stretchable resin layer to form a laminated film having a three-layer structure composed of a conductor foil or a carrier film, a stretchable resin layer, and a protective film.

The protective film is not particularly limited, and examples thereof include polyesters such as polyethylene terephthalate, polybutylene terephthalate, and polyethylene naphthalate; and polyolefins such as polyethylene and polypropylene. Among these, a film of a polyester such as polyethylene terephthalate or a polyolefin such as polyethylene or polypropylene may be used as the protective film from the viewpoint of flexibility and toughness. The protective film may be subjected to a release treatment using a silicone-based compound, a fluorine-containing compound and the like from the viewpoint of improving the releasability from the stretchable resin layer.

The thickness of the protective film may be appropriately changed depending on the intended flexibility, but it may be from 10 to 250 μm. The film strength tends to be sufficient when the thickness is 10 μm or more, and sufficient flexibility tends to be obtained when the thickness is 250 μm or less. From the above viewpoint, the thickness may be from 15 to 200 μm or from 20 to 150 μm.

The wiring substrate having a conductor foil according to an embodiment can be produced by, for example, a method including a step of preparing a laminated sheet (conductor substrate) having a stretchable resin layer and a conductor foil laminated on the stretchable resin layer, a step of forming an etching resist on the conductor foil, a step of exposing the etching resist and developing the etching resist after being exposed to form a resist pattern covering a portion of the conductor foil, a step of removing the conductor foil at a portion which is not covered with the resist pattern, and a step of removing the resist pattern.

Any method may be used as a method for obtaining a laminated sheet (conductor substrate) including a stretchable resin layer and a conductor foil, but there are a method in which the conductor foil is coated with a varnish of a resin composition for forming a stretchable resin layer and a method in which the conductor foil is laminated on the stretchable resin layer formed on a carrier film using a vacuum press, a laminator or the like. In a case in which the resin composition for forming a stretchable resin layer contains a crosslinking component, the stretchable resin layer is formed by progressing the crosslinking reaction (curing reaction) of the crosslinking component through heating or light irradiation.

As a method for laminating the stretchable resin layer on a carrier film on the conductor foil, any method may be used, but a roll laminator, a vacuum laminator, a vacuum press and the like are used. Molding may be conducted using a roll laminator or a vacuum laminator from the viewpoint of production efficiency.

The thickness of the stretchable resin layer after being dried is not particularly limited but is typically from 5 to 1.000 μm. When the thickness is in the above-described range, sufficient strength of the stretchable substrate is easily obtained and the amount of residual solvent in the resin film can be decreased since drying sufficiently proceeds.

A laminated sheet in which conductor foils are formed on both sides of the stretchable resin layer may be fabricated by further laminating a conductor foil on the surface on the side opposite to the conductor foil of the stretchable resin layer. It is possible to suppress warpage of the laminated sheet at the time of curing by providing and forming the conductor layer on both sides of the stretchable resin layer.

As a method for forming a wiring pattern on the conductor foil of the laminated sheet (laminated sheet for wiring substrate formation), a method using etching and the like is generally used. For example, in a case in which a copper foil is used as the conductor foil, for example, a mixed solution of concentrated sulfuric acid and hydrogen peroxide solution, a ferric chloride solution, and the like can be used as the etching solution.

Examples of the etching resist to be used in etching include Photec H-7025 (trade name, manufactured by Hitachi Chemical Co., Ltd.), and Photec H-7030 (trade name, manufactured by Hitachi Chemical Co., Ltd.), and X-87 (trade name, manufactured by TAIYO HOLDINGS CO., LTD.). The etching resist is typically removed after formation of the wiring pattern.

An embodiment of a method for producing a wiring substrate having a conductor plating film includes a step of forming a conductor plating film on a stretchable resin layer by electroless plating, a step of forming a plating resist on the conductor plating film, a step of exposing the plating resist and developing the plating resist after being exposed to form a resist pattern covering a portion of the stretchable resin layer, a step of further forming a conductor plating film on the conductor plating film at a portion which is not covered with the resist pattern by electrolytic plating, a step of removing the resist pattern, and a step of removing a portion that is not covered with the conductor plating film formed by electrolytic plating, of the conductor plating film formed by electroless plating.

Still another embodiment of a method for producing a wiring substrate includes a step of forming an etching resist on a conductor plating film formed on a stretchable resin layer, a step of exposing the etching resist and developing the etching resist after being exposed to form a resist pattern covering a portion of the stretchable resin layer, a step of removing the conductor plating film at a portion which is not covered with the resist pattern, and a step of removing the resist pattern.

Examples of the plating resist to be used as a mask for plating include Photec RY3325 (trade name, manufactured by Hitachi Chemical Co., Ltd.), Photec RY-5319 (trade name, manufactured by Hitachi Chemical Co., Ltd.), and MA-830 (trade name, manufactured by TAIYO HOLDINGS CO., LTD.). In addition to these, details on electroless plating and electrolytic plating are as described above.

A stretchable device can be obtained by mounting various kinds of electronic elements on the wiring substrate.

EXAMPLES

The present invention will be described more specifically with reference to the following Examples. However, the present invention is not limited to these Examples.

Study 1

1-1. Preparation of Varnish for Stretchable Resin Layer Formation

Resin Varnish A

Resin varnish A was obtained by mixing 30 g of hydrogenated styrene butadiene rubber (TUFTEC P1500, trade name, manufactured by Asahi Kasei Corp.) as the component (A) and 70 g of toluene while stirring these.

Resin Varnish B

Resin varnish B was obtained by mixing 20 g of hydrogenated styrene butadiene rubber (DYNARON 2324P, trade name, manufactured by JSR Corporation) as the component (A), 5 g of butanediol acrylate (FANCRYL FA-124AS, trade name, manufactured by Hitachi Chemical Co., Ltd.) as the component (B), 0.4 g of bis(2,4,6-trimethylbenzoyl)phenylphosphine oxide (Irgacure 819, trade name, manufactured by BASF SE) as the component (C), and 15 g of toluene as a solvent while stirring these.

Resin Varnish C

Resin varnish C was obtained by mixing 20 g of an acrylic polymer (KURARITY LA2140, trade name, manufactured by Kuraray Co., Ltd.) as the component (A), 5 g of a fatty chain-modified epoxy resin (EXA 4816, trade name, manufactured by DIC Corporation) as the component (B), 0.5 g of 2-phenylimidazole (2PZ, trade name, manufactured by SHIKOKU CHEMICALS CORPORATION) as the component (C), and 15 g of methyl ethyl ketone as a solvent while stirring these.

Resin Varnish D

With 50 g of a biphenyl aralkyl type epoxy resin (NC-3000H, trade name, manufactured by Nippon Kayaku Co., Ltd.), 25.0 g of methyl ethyl ketone was mixed. Thereto, 20 g of a phenol novolac type phenol resin (TD2131, trade name, manufactured by DIC Corporation) was added, and 0.15 g of 2-phenylimidazole (2PZ, trade name, manufactured by SHIKOKU CHEMICALS CORPORATION) was further added thereto as a curing accelerator. Thereafter, the mixture was diluted with methyl ethyl ketone to obtain resin varnish D.

1-2. Fabrication of Laminated Sheet with Conductor Layer

Example 1-1

Laminated Film having Stretchable Resin Layer

A release-treated polyethylene terephthalate (PET) film ("Purex A31" manufactured by Teijin Film Solutions Limited, thickness: 25 μm) was prepared as a carrier film. The release-treated surface of this PET film was coated with the resin varnish A using a knife coater ("SNC-350" manufactured by YASUI SEIKI CO., LTD. The coating film was dried in a dryer ("MSO-80TPS" manufactured by Futaba Kagaku) at 100° C. for 20 minutes to form a stretchable resin layer having a thickness of 100 μm after coating. A release-treated PET film the same as the carrier film was stuck on the stretchable resin layer formed as a protective film in a direction in which the release-treated surface faced the stretchable resin layer side, thereby obtaining a laminated film A.

Laminated Sheet with Conductor Layer

The protective film of the laminated film A was peeled off therefrom, and the stretchable resin layer of the laminated film A was superposed on the roughened surface side of a copper foil (YGP-12, trade name, manufactured by Nippon Denkai, Ltd.). These were pressure-bonded under conditions of a pressure of 0.5 MPa, a temperature of 90° C., and a pressing time of 60 seconds using a vacuum pressure type laminator ("V130" manufactured by Nichigo Morton Co., Ltd.), thereby fabricating a laminated sheet with a conductor layer.

Example 1-2

A laminated body having a copper foil and an uncured resin layer was obtained in the same manner as in Example 1-1 except that the resin varnish A was changed to the resin varnish B and the copper foil was changed to another copper foil (BHY-82F-HA-V2-12 μm, trade name, manufactured by JX Nippon Mining & Metals Corporation). Thereafter, the resin layer was cured by being irradiated with ultraviolet light (wavelength: 365 nm) at 2000 mJ/cm$^2$ using an ultraviolet exposure machine ("ML-320FSAT" manufactured by Mikasa Co., Ltd.), thereby obtaining a laminated sheet with a conductor layer.

Examples 1-3

A laminated body having a copper foil and an uncured resin layer was obtained in the same manner as in Example 1-1 except that the resin varnish A was changed to the resin varnish C. Thereafter, the resin layer was cured under conditions of 180° C. and 1 hour using a dryer, thereby obtaining a laminated sheet with a conductor layer.

Comparative Example 1-1

A laminated body having a copper foil and an uncured resin layer was obtained in the same manner as in Example 1-1 except that the resin varnish A was changed to the resin varnish D. Thereafter, the resin layer was cured under conditions of 180° C. and 1 hour using a dryer, thereby obtaining a laminated sheet with a conductor layer.

Fabrication and Evaluation of Wiring Substrate

Figure 2:
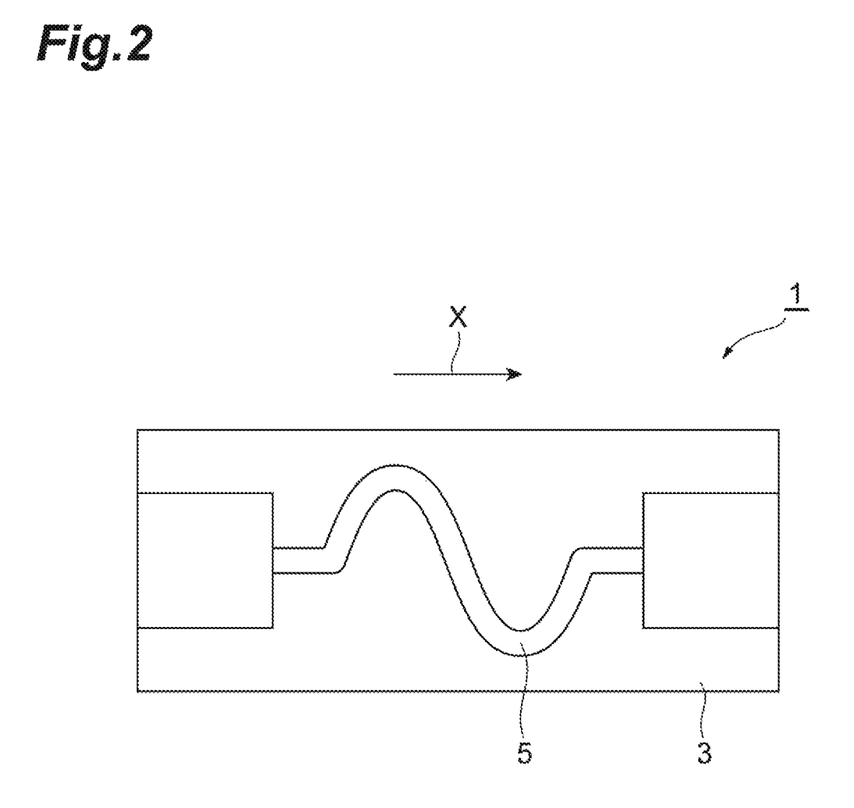
FIG. 2 is a plan view illustrating an embodiment of a wiring substrate.

A wiring substrate 1 for test having a stretchable resin layer 3 and a conductor foil which was formed on the stretchable resin layer 3 and had a wavelike pattern as a conductor layer 5 as illustrated in FIG. 2 was fabricated. First, an etching resist (Photec RY-5325, trade name, manufactured by Hitachi Chemical Co., Ltd.) was pasted onto the conductor layer of each laminated sheet with a conductor layer using a roll laminator, and a photo tool on which a wavelike pattern was formed was brought into close contact with the laminated sheet. The etching resist was exposed in an energy quantity of 50 mJ/cm$^2$ using an exposure machine, model EXM-1201 manufactured by ORC MANUFACTURING CO., LTD. Subsequently, spray development was conducted for 240 seconds using a 1% by weight aqueous solution of sodium carbonate at 30° C., the unexposed part of the etching resist was dissolved, and a resist pattern having a wavelike opening was thus formed. Subsequently, the copper foil at a portion which was not covered with the resist pattern was removed using an etching solution. Thereafter, the etching resist was removed using a peeling off liquid, thereby obtaining a wiring substrate 1 having the conductor foil 5 on which a wavelike wiring pattern which had a wiring width of 50 μm and meandered along a predetermined direction X was formed on the stretchable resin layer 3.

The stretchable resin layer and the wavelike wiring pattern were observed when the wiring substrate obtained was tensile-deformed in the direction of X to a strain of 10% and returned to the original state. The stretchable resin layer and the wiring pattern were evaluated as "A" in the case of not undergoing fracture at the time of elongation and as "C" in the case of undergoing fracture at the time of elongation.

TABLE 1

|  | Example 1-1 | Example 1-2 | Example 1-3 | Comparative Example 1-1 |
|---|---|---|---|---|
| Stretchable resin layer | A | A | A | C |
| Wiring pattern | A | A | A | C |

The evaluation results for Examples 1-1 to 1-3 and Comparative Example 1-1 are presented in Table 1. In the wiring substrates which had a wavelike wiring pattern and were formed using the laminated sheets with conductor layer of Examples 1-1 to 1-3, it has been found that the stretchable resin layer does not fracture even when being elongated to 10% and the appearance of the wavelike wiring pattern also does not have a problem. On the other hand, in Comparative Example 1-1, it has been found that the resin layer fractures before being elongated to 10% and the wiring also fractures at the same time since the resin layer does not exhibit stretchability.

Study 2

Example 2-1

Resin Varnish

A resin varnish was obtained by mixing 10 g of maleic anhydride-modified styrene ethylene butadiene rubber (FG1924GT, trade name, manufactured by Kraton Corporation) as the component (A), 2.5 g of dicyclopentadiene type epoxy resin (EPICLON HP7200H, trade name, manufactured by DIC Corporation) as the component (B), 0.38 g of 1-benzyl-2-methylimidazole (1B2MZ, trade name, manufactured by SHIKOKU CHEMICALS CORPORATION) as the component (C) (curing accelerator), and 50 g of toluene while stirring these.

Laminated Film

A release-treated polyethylene terephthalate (PET) film ("Purex A31" manufactured by Teijin Film Solutions Limited, thickness: 25 μm) was prepared as a carrier film. The release-treated surface of this PET film was coated with the above-described resin varnish using a knife coater ("SNC-350" manufactured by YASIA SEIKI CO., LTD. The coating film was dried in a dryer ("MSO-80TPS" manufactured by Futaba Kagaku) at 100° C. for 20 minutes to form a resin layer having a thickness of 100 μm. A release-treated PET film the same as the carrier film was stuck on the resin layer formed as a protective film in a direction in which the release-treated surface faced the resin layer side, thereby obtaining a laminated film Fabrication of Conductor Substrate The protective film of the laminated film was peeled off therefrom, and an electrolytic copper foil (F2-WS-12, trade name, manufactured by Furukawa Electric Co., Ltd.) having a roughened surface with a surface roughness Ra of 1.5 μm was superposed on the resin layer exposed in a direction in which the roughened surface faced the resin layer side. In this state, the electrolytic copper foil was laminated on the resin layer under conditions of a pressure of 0.5 MPa, a temperature of 90° C., and a pressing time of 60 seconds using a vacuum pressure type laminator ("V130" manufactured by Nikko-Materials Co., Ltd.). Thereafter, the laminated product was heated in a dryer ("MSO-80TPS" manufactured by Futaba Kagaku) at 180° C. for 60 minutes, thereby obtaining a conductor substrate having a stretchable resin layer which was a cured product of a resin layer and an electrolytic copper foil.

Example 2-2

A resin varnish was obtained by mixing 10 g of maleic anhydride-modified styrene ethylene butadiene rubber (FG1924GT, trade name, manufactured by Kraton Corporation) as the component (A), 2.5 g of dicyclopentadiene type epoxy resin (EPICLON HP7200H, trade name, manufactured by DIC Corporation) as the component (B), 0.38 g of 1-benzyl-2-methylimidazole (1B2MZ, trade name, manufactured by SHIKOKU CHEMICALS CORPORATION) as the component (C) (curing accelerator), 0.1 g of a phenol-based antioxidant (AO-60, trade name, manufactured by ADEKA Corporation), 0.1 g of a phosphite antioxidant (2112, trade name, manufactured by ADEKA Corporation), and 50 g of toluene while stirring these. A laminated film and a conductor substrate having a resin layer were fabricated in the same manner as in Example 2-1 using the resin varnish obtained.

Evaluation

Heat Resistance Test

Figure 3:
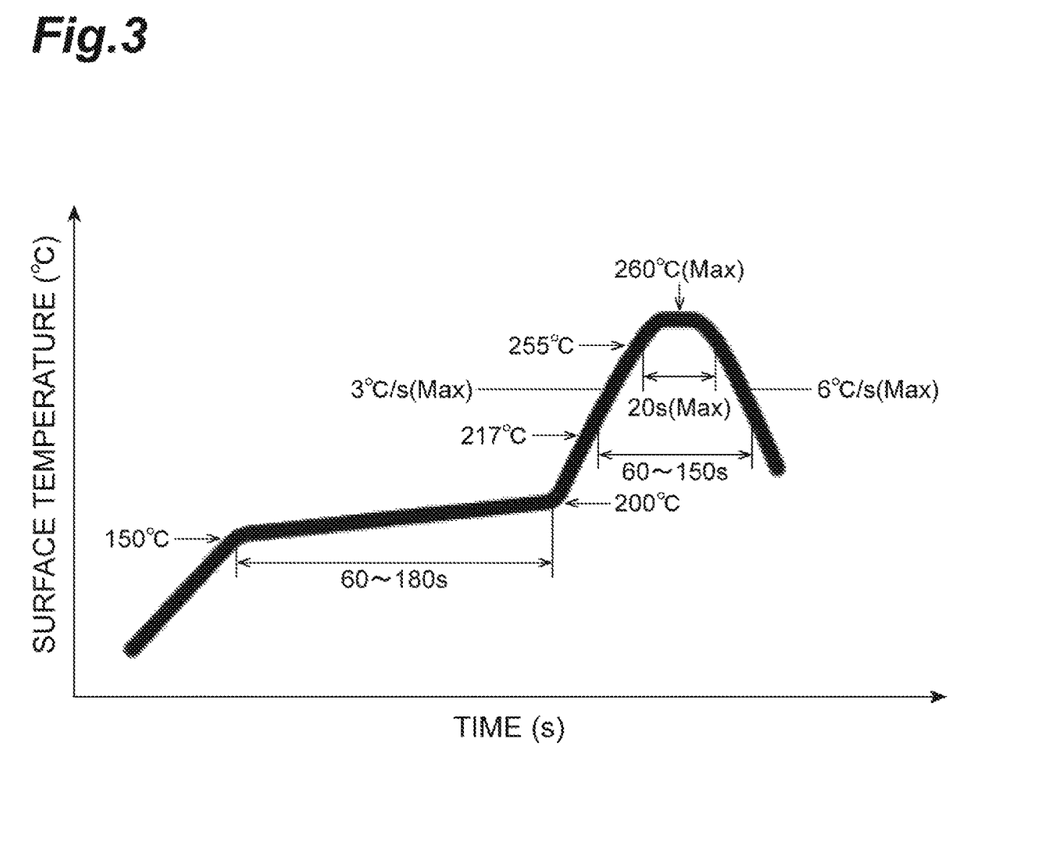
FIG. 3 is a graph illustrating a temperature profile in a heat resistance test.

The resin layer was cured by heating the laminated film at 180° C. for 60 minutes to form a stretchable resin layer. The carrier film and the protective film were removed from the laminated film, and a heat resistance test in which the stretchable resin layer was subjected to a heat treatment in the temperature profile of FIG. 3 was conducted in conformity to IPC/JEDEC J-STD-020 using a nitrogen reflow system (TNV-EN, manufactured by TAMURA CORPORATION). The elongation and the elastic modulus in tension of the stretchable resin layer before and after the heat resistance test were measured. The conductor substrate was also subjected to the same heat resistance test, and the 90 degree peel strength before and after the heat resistance test was measured.

Elastic Modulus in Tension and Elongation at Break

A test piece of a strip-shaped stretchable resin layer having a length of 40 mm and a width of 10 mm was prepared. A tension test of this test piece was conducted using Autograph ("EZ-S" manufactured by SHIMADZU CORPORATION), and a stress-strain curve was obtained. The elastic modulus in tension and elongation at break were determined from the stress-strain curve obtained. The tension test was conducted under conditions of a distance between chucks of 20 mm and a tension speed of 50 mm/min. The elastic modulus in tension was determined from the slope of the stress-strain curve in a stress range of from 0.5 to 1.0 N. The strain at the time point at which the test piece fractured was recorded as the elongation at break.

Adhesion Property (90 Degree Peel Strength)

The 90 degree peel strength between the copper foil and the stretchable resin layer was measured by a peel test in which the copper foil was peeled off from the conductor substrate at a peel angle of 90 degree.

Tackiness

The resin layer was cured by heating the laminated film at 180° C. for 60 minutes to form a stretchable resin layer. A test piece of the laminated film having a length of 70 mm and a width of 20 mm was prepared by removing the carrier film and the protective film from the laminated film after being cured. The tackiness on the surface of the stretchable resin layer exposed was measured using a tacking tester ("TAC II" manufactured by RHESCA Co., LTD.). The measurement conditions were set so that the mode was a constant load mode, the immersion speed was 120 mm/min, the test speed was 600 mm/min, the load was 100 gf, the duration of the test force full load application time was 1 s, and the temperature was 30° C.

TABLE 2

| | | | Example 2-1 | Example 2-2 |
|---|---|---|---|---|
| Tension test of stretchable resin layer | Elongation at break | Initial | 500% | 500% |
| | | After heat resistance test | 480% | 490% |
| | Elastic modulus | Initial | 5.5 MPa | 5.5 MPa |
| | | After heat resistance test | 5.2 MPa | 5.4 MPa |
| Adhesion property (copper foil/stretchable resin layer) | | Initial | >1 kN/m | >1 kN/m |
| | | After heat resistance test | >1 kN/m | >1 kN/m |
| Tackiness (stretchable resin layer) | | | 3.0 gf/mm$^2$ | 3.0 gf/mm$^2$ |

As presented in Table 2, the stretchable resin layers of Example 2-1 and Example 2-2 maintained excellent stretchability and high adhesion property to the copper foil even after the heat resistance test. In addition, the tackiness of the stretchable resin layer was properly low and the stretchable resin layer also exhibited excellent handling properties.

High Temperature Long Term Storage Test

The resin layer was cured by heating the laminated film at 180° C. for 60 minutes to form a stretchable resin layer. The carrier film and the protective film were removed from the laminated film after being cured, and a high temperature long term storage test was conducted in which the stretchable resin layer was left to stand in a safety oven (SPH (H)-102 manufactured by ESPEC CORP.) in an air atmosphere under conditions of 160° C. and 168 hours. The elongation at break and elastic modulus before and after the high temperature long term storage test were measured under the same conditions as those described above. In addition, the appearance of the stretchable resin layer after the high temperature long term storage test was visually observed and the presence or absence of discoloration was examined. For Example 2-2, adhesion property was also evaluated.

TABLE 3

| | | | Example 2-1 | Example 2-2 |
|---|---|---|---|---|
| Tension test of stretchable resin layer | Elongation after fracture | Initial | 500% | 500% |
| | | After high temperature long term test | 50% | 480% |
| | Elastic modulus | Initial | 5.4 MPa | 5.5 MPa |
| | | After high temperature long term test | 1.5 MPa | 5.0 MPa |
| Adhesion property (copper foil/stretchable resin layer) | | Initial | >1 kN/m | >1 kN/m |
| | | After heat resistance test | — | >1 kN/m |
| Discoloration after high temperature long term storage test | | | Presence | Absence |

As presented in Table 3, the stretchable resin layer containing an antioxidant of Example 2-2 did not have changes in properties and the discoloration thereof was not acknowledged even after the high temperature long term storage test under conditions of 160° C. and 168 hours. The stretchable resin layer of Example 2-1 maintained the initial properties in the heat resistance test, but changes in properties were acknowledged after a stricter high temperature long term storage test. It can be said that the application of an antioxidant is effective particularly in uses required to exhibit high heat resistance.

Study 3

Example 3-1

Fabrication of Laminated Body with Conductor Layer

The protective film was peeled off from the laminated film A in Study 1, and the stretchable resin layer was immersed in a mixed solution of Swelling Dip Securiganth P (1000 mL/L, trade name, manufactured by Atotech) and MOH (3 g/L) as a swelling conditioner at 70° C. for 5 minutes. Then the stretchable resin layer was immersed in a mixed solution of Concentrate Compact CP (640 mL/L, trade name, manufactured by Atotech) and NaOH (40 g/L) as a roughening liquid at 70° C. for 10 minutes. Subsequently, the stretchable resin layer was immersed in a mixed solution of Reduction Solution Securiganth P500 (200 mL/L, trade name, manufactured by Atotech) and $H_2SO_4$: 100 mL/L) as a neutralization solution at 40° C. for 5 minutes.

Subsequently, as a pretreatment for electroless plating, the stretchable resin layer was immersed in Cleaner Securiganth 902 (40 mL/L, trade name, manufactured by Atotech) as a conditioner liquid at 60° C. for 5 minutes and then washed with water. Next, as a pre-dipping step, the stretchable resin layer was immersed in a mixed solution of Pre Dip Neoganth B (20 mL/L, trade name, manufactured by Atotech) and sulfuric acid (1 mL/L) at 25° C. for 1 minute. Next, as a catalyst imparting step, the stretchable resin layer was immersed in a mixed solution of Activator Neoganth 834 Conc (40 mL/L, trade name, manufactured by Atotech), sodium hydroxide (4 g/L), and boric acid (5 g/L) at 35° C. for 5 minutes. Next, as a reduction step, the stretchable resin layer was immersed in a mixed solution of Reducer Neoganth WA (5 mL/L, trade name, manufactured by Atotech) and Reducer Accelerator 810 mod (100 mL/L, trade name, manufactured by Atotech) at 25° C. for 1 minute. Thereafter, as an electroless copper plating step, the stretchable resin layer was immersed in a mixed solution of Basic Solution Printganth MSK (80 mL/L, trade name, manufactured by Atotech) and Copper Solution Printganth MSK (40 mL/L, trade name, manufactured by Atotech), Reducer Cu (14 mL/L, trade name, manufactured by Atotech), and Stabilizer Printganth MSK (3 mL/L, trade name, manufactured by Atotech) at 28° C. for 15 minutes to form a copper-plated film having a thickness of about 0.5 μm on the stretchable resin layer. Thereafter, the resultant stretchable resin layer was dried at 80° C. for 1.5 minutes using a dryer, and then copper plating was further formed thereon by copper sulfate electrolytic plating. Thereafter, an annealing treatment was conducted at 150° C. for 30 minutes, thereby obtaining a laminated sheet having a conductor layer with a thickness of 5 μm on the surface of a stretchable resin layer.

Example 3-2

A laminated film having an uncured resin layer was obtained in the same manner as in Example 3-1 except that the resin varnish A was changed to the resin varnish B in Study 1. The protective film of the laminated film was peeled off, and then the resin layer of the laminated film was cured by being irradiated with ultraviolet light (wavelength: 365 nm) in an energy quantity of 2000 mJ/cm² using an ultraviolet exposure machine ("ML-320FSAT" manufactured by Mikasa Co., Ltd.) to form a stretchable resin layer. A conductor layer was formed on the stretchable resin layer formed through plating in the same manner as in Example 3-1, thereby obtaining a laminated sheet with a conductor layer.

Example 3-3

A laminated film having an uncured resin layer was obtained in the same manner as in Example 3-1 except that the resin varnish A was changed to the resin varnish C in Study 1. Thereafter, the resin layer was cured under conditions of 180° C. and 1 hour using a dryer to form a stretchable resin layer. A conductor layer was formed on the stretchable resin layer formed through plating in the same manner as in Example 3-1, thereby obtaining a laminated sheet with a conductor layer.

Comparative Example 3-1

A laminated film having an uncured resin layer was obtained in the same manner as in Example 3-1 except that the resin varnish A was changed to the resin varnish D in Study 1. Thereafter, the resin layer was cured under conditions of 180° C. and 1 hour using a dryer to form a stretchable resin layer. A conductor layer was formed on the stretchable resin layer formed through plating in the same manner as in Example 3-1, thereby obtaining a laminated sheet with a conductor layer.

Fabrication and Evaluation of Wiring Substrate

A wiring substrate 1 for test having a stretchable resin layer 3 and a conductor plating film which was formed on the stretchable resin layer 3 and had a wavelike pattern as a conductor layer 5 as illustrated in FIG. 2 was fabricated. First, an etching resist (Photec R1-5325, trade name, manufactured by Hitachi Chemical Co., Ltd.) was pasted onto the conductor layer of each laminated sheet with a conductor layer using a roll laminator, and a photo tool on which a wavelike pattern was formed was brought into close contact with the laminated sheet. The etching resist was exposed in an energy quantity of 50 mJ/cm$^2$ using an exposure machine, model EXM-1201 manufactured by ORC MANUFACTURING CO., LTD. Subsequently, spray development was conducted for 240 seconds using a 1% by weight aqueous solution of sodium carbonate at 30° C., the unexposed part of the etching resist was dissolved, and a resist pattern having a wavelike opening was thus formed. Subsequently, the copper foil at a portion which was not covered with the resist pattern was removed using an etching solution. Thereafter, the etching resist was removed using a peeling off liquid, thereby Obtaining a wiring substrate 1 having the conductor plating film 5 on which a wavelike wiring pattern which had a wiring width of 50 μm and meandered along a predetermined direction X was formed on the stretchable resin layer 3.

The stretchable resin layer and the wavelike wiring pattern were observed when the wiring substrate obtained was tensile-deformed in the direction of X to a strain of 10% and returned to the original state. The stretchable resin layer and the wiring pattern were evaluated as "A" in the case of not undergoing fracture at the time of elongation and as "C" in the case of undergoing fracture at the time of elongation.

TABLE 4

| | Example 3-1 | Example 3-2 | Example 3-3 | Comparative Example 3-1 |
|---|---|---|---|---|
| Stretchable resin layer | A | A | A | C |
| Wiring pattern | A | A | A | C |

The evaluation results for Examples 34 to 3-3 and Comparative Example 3-1 are presented in Table 4. In the wiring substrates which had a wavelike wiring pattern and were formed using the conductor substrates (laminated sheets with conductor layer) of Examples 3-1 to 3-3, it has been found that the stretchable resin layer does not fracture even when being elongated to 10% and the appearance of the wavelike wiring pattern also does not have a problem. On the other hand, in Comparative Example 3-1, it has been found that the resin layer fractures before being elongated to 10% and the wiring also fractures at the same time since the resin layer does not exhibit stretchability.

INDUSTRIAL APPLICABILITY

The conductor substrate and the wiring substrate obtained therefrom of the present invention are expected to be applied, for example, as a substrate of a wearable device.

REFERENCE SIGNS LIST

1: wiring board, 3: stretchable resin layer, 5: conductor layer (conductor foil or conductor plating film).

The invention claimed is:

1. A conductor substrate comprising:
    a stretchable resin layer containing a cured product of a resin composition containing (A) a rubber component comprising at least one kind of rubber selected from the group consisting of isoprene rubber, butyl rubber, styrene butadiene rubber, butadiene rubber, acrylonitrile butadiene rubber, silicone rubber, urethane rubber, chloroprene rubber, ethylene propylene rubber, fluororubber, sulfurized rubber, epichlorohydrin rubber, and chlorinated butyl rubber, and (B) a crosslinking component, wherein a content of (A) the rubber component is from 30% to 100% by mass with respect to 100% by mass of the stretchable resin layer; and
    a conductor foil provided on the stretchable resin layer, wherein a recovery factor after the stretchable resin layer is tensile-deformed to a strain of 20% is 80% or more.

2. The conductor substrate according to claim 1, wherein an elastic modulus of the conductor foil is from 40 to 300 GPa.

3. The conductor substrate according to claim 1, wherein (A) the rubber component contains rubber having a crosslinking group.

4. The conductor substrate according to claim 3, wherein the crosslinking group is at least either of an acid anhydride group or a carboxyl group.

5. The conductor substrate according to claim 1, wherein (B) the crosslinking component comprises a compound having at least one kind of reactive group selected from the group consisting of a (meth)acrylic group, a vinyl group, an epoxy group, a styryl group, an amino group, an isocyanurate group, a ureido group, a cyanate group, an isocyanate group, and a mercapto group.

6. The conductor substrate according to claim 1, wherein the resin composition further contains (C) at least either of a curing agent or a curing accelerator.

7. The conductor substrate according to claim 1, wherein the stretchable resin layer further contains an antioxidant.

8. A wiring substrate comprising:
    the conductor substrate according to claim 1,
    wherein the conductor foil forms a wiring pattern.

9. A stretchable device comprising:
    the wiring substrate according to claim 8; and
    an electronic element mounted on the wiring substrate.

10. A method for producing the wiring substrate according to claim 8, comprising:
    preparing a laminated sheet including the stretchable resin layer and the conductor foil laminated on the stretchable resin layer;
    forming an etching resist on the conductor foil;
    exposing the etching resist and developing the etching resist after being exposed to form a resist pattern covering a portion of the conductor foil;
    removing a portion of the conductor foil which is not covered with the resist pattern; and
    removing the resist pattern.

11. A conductor substrate comprising:
    a stretchable resin layer containing a cured product of a resin composition containing (A) a rubber component comprising at least one kind of rubber selected from the group consisting of isoprene rubber, butyl rubber, styrene butadiene rubber, butadiene rubber, acrylonitrile butadiene rubber, silicone rubber, urethane rubber, chloroprene rubber, ethylene propylene rubber, fluororubber, sulfurized rubber, epichlorohydrin rubber, and chlorinated butyl rubber, and (B) a crosslinking component, wherein a content of (A) the rubber component is from 30% to 100% by mass with respect to 100% by mass of the stretchable resin layer; and
    a conductor plating film provided on the stretchable resin layer, wherein a recovery factor after the stretchable resin layer is tensile-deformed to a strain of 20% is 80% or more.

12. A wiring substrate comprising:
the conductor substrate according to claim 11,
wherein the conductor plating film forms a wiring pattern.

13. A method for producing the wiring substrate according to claim 12, comprising:
forming a plating resist on the stretchable resin layer;
exposing the plating resist and developing the plating resist after being exposed to form a resist pattern covering a portion of the stretchable resin layer;
electrolessly plating the conductor plating film on a surface of a portion of the stretchable resin layer which is not covered with the resist pattern; and
removing the resist pattern.

14. A method for producing the wiring substrate according to claim 12, comprising:
electrolessly plating the conductor plating film on the stretchable resin layer;
forming a plating resist on the conductor plating film formed by electroless plating;
exposing the plating resist and developing the plating resist after being exposed to form a resist pattern covering a portion of the stretchable resin layer;
electrolytically plating a conductor plating film on a portion of the conductor plating film formed by electroless plating which is not covered with the resist pattern;
removing the resist pattern; and
removing a portion of the conductor plating film formed by electroless plating not covered with the conductor plating film formed by electrolytic plating.

15. A method for producing the wiring substrate according to claim 12, comprising:
forming an etching resist on the conductor plating film formed on the stretchable resin layer;
exposing the etching resist and developing the etching resist after being exposed to form a resist pattern covering a portion of the stretchable resin layer;
removing a portion of the conductor plating film not covered with the resist pattern; and
removing the resist pattern.

16. The conductor substrate according to claim 11, wherein (B) the crosslinking component comprises a compound having at least one kind of reactive group selected from the group consisting of a (meth)acrylic group, a vinyl group, an epoxy group, a styryl group, an amino group, an isocyanurate group, a ureido group, a cyanate group, an isocyanate group, and a mercapto group.

* * * * *